United States Patent
Chu et al.

(10) Patent No.: US 6,403,411 B1
(45) Date of Patent: Jun. 11, 2002

(54) METHOD FOR MANUFACTURING LOWER ELECTRODE OF DRAM CAPACITOR

(75) Inventors: Chih-Hsun Chu, Hsinchu; Horng-Nan Chern, Tainan Hsien; Kevin Lin, Taipei Hsien; Kuo-Tai Huang; Wen-Yi Hsieh, both of Hsinchu; Tri-Rung Yew, Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/208,601

(22) Filed: Dec. 8, 1998

(51) Int. Cl.[7] .......................................... H01L 21/8234
(52) U.S. Cl. ..................... 438/238; 438/253; 438/254; 438/255; 438/396
(58) Field of Search ................................ 438/238, 253, 438/254, 255, 396, 239, 398

(56) References Cited

U.S. PATENT DOCUMENTS

| 5,422,295 A | * | 6/1995 | Choi et al. | 437/52 |
|---|---|---|---|---|
| 5,840,606 A | * | 11/1998 | Lee | 438/255 |
| 5,888,865 A | * | 3/1999 | Lin | 438/253 |
| 5,940,703 A | * | 8/1999 | Hong | 438/254 |
| 5,952,039 A | * | 9/1999 | Hong | 427/79 |
| 5,989,955 A | * | 11/1999 | Hsu | 438/453 |
| 5,994,197 A | * | 11/1999 | Liao | 438/396 |
| 6,121,109 A | * | 9/2000 | Chen et al. | 438/396 |

* cited by examiner

Primary Examiner—Amir Zarabian
Assistant Examiner—Pho Luu
(74) Attorney, Agent, or Firm—Charles C. H. Wu; Charles C. H. Wu & Associates

(57) ABSTRACT

A method for manufacturing the lower electrode of a DRAM capacitor. The method includes depositing polysilicon instead of amorphous silicon to form the lower electrode. Because polysilicon has a higher depositing temperature, it has a higher depositing rate capable of shortening depositing time. After forming the polysilicon lower electrode, the upper portion of the polysilicon layer is transformed into an amorphous layer by bombarding the polysilicon layer with ions to damage its internal structure. Eventually, hemispherical grain silicon is able to grow over the lower electrode, thereby increasing its surface area.

9 Claims, 3 Drawing Sheets

METHOD FOR MANUFACTURING LOWER ELECTRODE OF DRAM CAPACITOR

BACKGROUND OF THE INVENTION

1. Field of Invention

The present invention relates to a method for manufacturing a semiconductor device. More particularly, the present invention relates to a method for manufacturing the lower electrode of a DRAM capacitor.

2. Description of Related Art

As long as the trend for forming highly integrated circuit continues, methods capable of forming devices having smaller dimensions must be developed. Right now, semiconductor devices having sub-micron line width are being manufactured. In the past, the means of increasing the packing density of integrated circuit devices has included the reduction of their structural dimensions. For a DRAM capacitor, that means a reduction of the surface area of its electrode. However, by so doing, the amount of electric charge that can be stored in the capacitor is greatly reduced.

In general, the amount of stored charge within a DRAM capacitor must be above a certain threshold level so that the stored data can be retrieved correctly. When some of the dimensions of a DRAM capacitor are reduced, the maximum amount of charge the capacitor is capable of storing will drop correspondingly. Furthermore, as the charge-storing capacity of the capacitor drops, the frequency of refreshes necessary to compensate for the charges lost due to current leakage must be increased. Constant refreshes will compromise the data processing speed of the DRAM. Hence, a method to reduce the area occupied by a capacitor on a semiconductor substrate without decreasing its storage capacity is a major issue for design engineers.

One solution to the charge storage problem of a DRAM capacitor is to grow hemispherical grain silicon (HSG-Si) over the silicon surface of the lower electrode. Given two capacitors formed using the same materials and having the same distance of separation between upper and lower electrodes, the capacitor with HSG-Si coating on its lower electrode can have twice the capacitance of the one without the coating.

FIGS. 1A through 1C are cross-sectional views showing the progression of manufacturing steps according to a conventional method of fabricating the lower electrode of a DRAM capacitor. First, as shown in FIG. 1A, a source/drain region 120 is formed in a substrate 110. Then, a dielectric layer 130 is deposited over the substrate 110. Next, photo-lithographic and etching operations are carried out to form a node contact opening 140 in the dielectric layer 130. Thereafter, a low-pressure chemical vapor deposition (LPCVD) method is used to deposit amorphous silicon over the dielectric layer 130 and into the node contact opening 140 to form an amorphous silicon (α-Si) layer 150a. Usually, the LPCVD operation is carried out at a temperature of slightly below 520° C. using silane ($SiH_4$) as a gaseous reactant.

In general, the process of forming a polysilicon layer and the process of forming an amorphous silicon layer using the LPCVD method are very similar. The main difference lies in their depositing temperatures. Normally, the temperature necessary for forming a polysilicon layer is higher, roughly between 600° C. and 650° C., while the deposition of an amorphous layer requires a lower temperature of between 500° C. and 550° C. This is because a higher processing temperature imparts greater energy to the atoms near the surface of the silicon, and a higher atomic mobility facilitates the nucleation of atoms to form large crystals.

However, lowering the operating temperature will decrease the rate of deposition of amorphous silicon considerably. For example, the rate of deposition is around 100 Å/min at 600° C., but drops to only 25 Å/min at 550° C. If the processing temperature is further reduced to about 520° C., the deposition rate will drop to just 8 Å/min. At present, devices having a line width smaller than 0.25 μm are often fabricated, requiring the dimensions of a DRAM capacitor to be reduced as well. To maintain sufficient capacitance within a diminished chip area, the capacitor has to extend in the vertical direction, forming a so-called stacked capacitor structure. In other words, the node height of a capacitor NH as shown in FIG. 1A has to increase. For example, the node height for a DRAM capacitor in a 0.25 μm line width integrated circuit must be greater than 6000 Å. Therefore, the time spent depositing an amorphous silicon layer to the necessary thickness is very long. At a depositing rate of about 8 Å/min at 520° C., the time required to deposit an amorphous silicon layer having a thickness of about 8000 Å is roughly 16 hours. Such a long period not only brings down productivity considerably, but also encourages the previously deposited amorphous silicon layer to re-crystallize. The re-crystallized polysilicon lumps 160 are also shown in FIG. 1A. This re-crystallized polysilicon 160 will affect the subsequent growth of the HSG-Si layer over the silicon layer. To avoid re-crystallization completely, the deposition temperature must drop to below 510° C. However, dropping the deposition temperature will lower the deposition rate even further, causing more efficiency problems.

In addition, to increase the electrical conductivity of the amorphous silicon layer, ions must be doped. There are three conventional methods of doping the amorphous silicon layer. The first method is to implant ions into the amorphous silicon layer directly. The second method is to use a thermal diffusion operation to drive dopants into the amorphous silicon layer. The third method is to carry out ion doping and amorphous silicon deposition in situ. If the third method is used, then diborane ($B_2H_6$) should be chosen as a source of dopants. This is because the higher the diborane concentration, the higher will be the deposition rate of amorphous silicon. On the other hand, if phosphine ($PH_3$) or arsine ($AsH_3$) is used as the source of dopants, then a higher concentration will decrease the rate of deposition of the amorphous silicon. Diborane can easily disintegrate into unstable $BH_3$ radicals on the surface of silicon and accelerate the disintegration of silane ($SiH_4$), thereby facilitating silicon deposition reaction. Phosphine and arsine, however, tend to be strongly attached to the silicon surface, preventing the disintegration of silane and thereby slowing the deposition rate of silicon.

Next, as shown in FIG. 1B, the amorphous silicon layer 150a is patterned to form a lower electrode 150b. Note that some of the polysilicon lumps 160 embedded within the lower electrode 150b are exposed on the surface 165.

Next, as shown in FIG. 1C, a seeding operation is carried out, and then the substrate 110 is annealed in a high vacuum at a temperature between 550° C. to 570° C. Ultimately, HSG-Si 170 is formed over the exposed lower electrode 150b, creating a rather large lower electrode 150c surface. However, HSG-Si is not grown over the exposed surface 165, which contains polysilicon 160. This is because the HSG-Si is formed by using the heat in the annealing operation to re-crystallize the amorphous silicon atoms around the nucleation centers planted during the seeding operation. Since the polysilicon already has a definite degree of crystallinity and its energy state is quite stable, no re-crystallization will happen on the surface of a polysilicon layer, and so HSG-Si cannot grow. Therefore, in the presence of polysilicon 160, the increase in surface area of the lower electrode 150c after growing an HSG-Si layer will be much lower than the potential maximum. Moreover, the annealing temperature (550° C. to 570° C.) is much higher than the deposition temperature (500° C. to 550° C.). Thus, re-crystallization of the amorphous silicon layer to form more polysilicon can occur during the annealing period. Consequently, the area capable of growing HSG-Si is further diminished.

SUMMARY OF THE INVENTION

Accordingly, the present invention is to provide a method that is capable of reducing production time for manufacturing the lower electrode of a DRAM capacitor.

To achieve these and other advantages and in accordance with the purpose of the invention, as embodied and broadly described herein, the invention provides a method for manufacturing the lower electrode of a DRAM capacitor. The method includes depositing polysilicon instead of amorphous silicon to form the lower electrode. Because polysilicon has a higher depositing temperature, it has a higher depositing rate and thus requires a shorter depositing time. After forming the polysilicon lower electrode, the upper portion of the polysilicon layer is transformed into an amorphous layer by bombarding the polysilicon layer with ions to damage its internal structure. Eventually, hemispherical grain silicon is able to grow over the lower electrode to increase its surface area.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
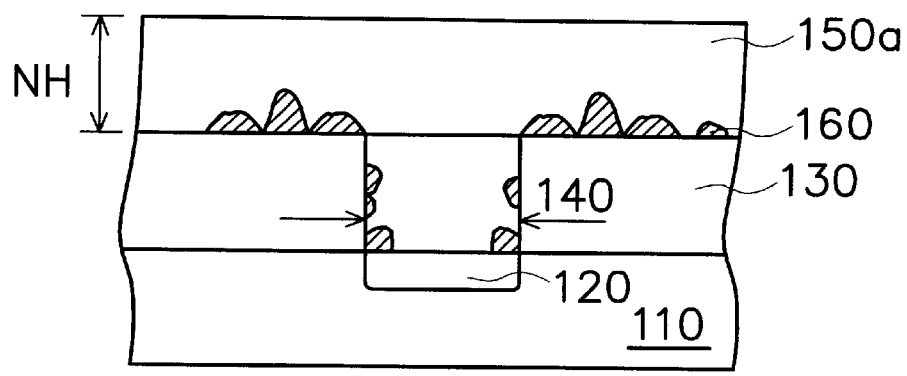
FIGS. 1A through 1C are cross-sectional views showing the progression of manufacturing steps according to a conventional method of fabricating the lower electrode of a DRAM capacitor.
Figure 1B:
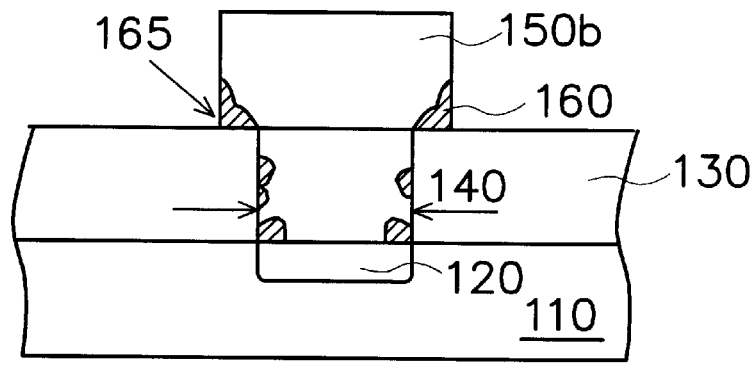
Figure 1C:
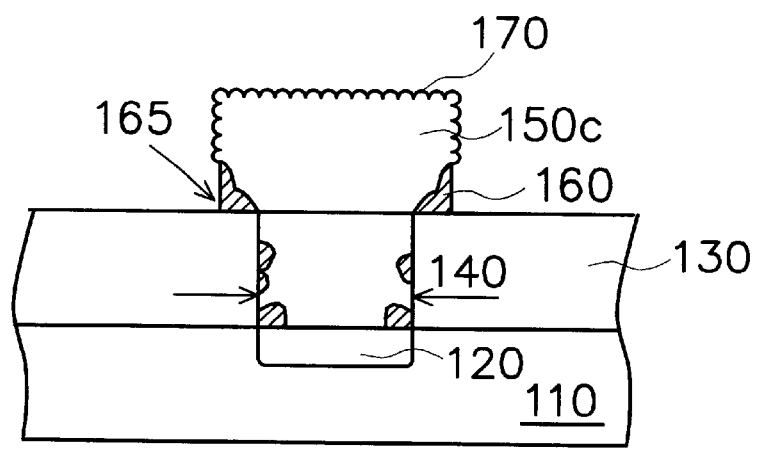

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are cross-sectional views showing the progression of manufacturing steps in fabricating the lower electrode of a DRAM capacitor according to one preferred embodiment of this invention.

Figure 2A:
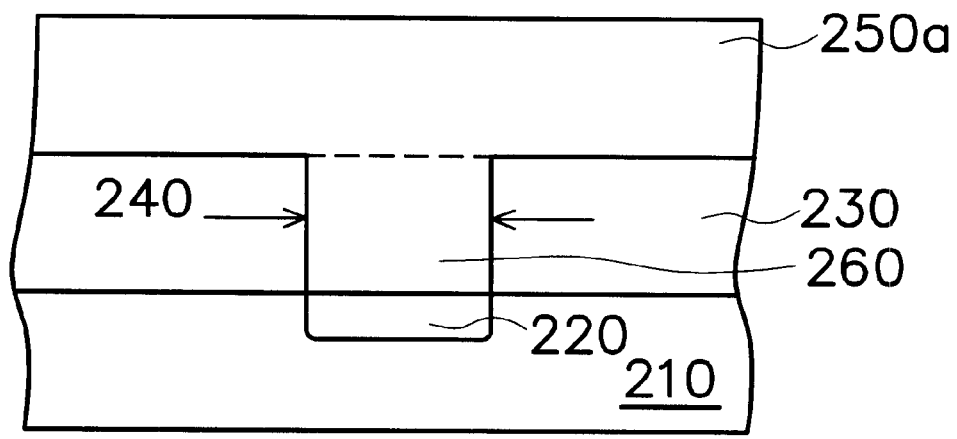
FIGS. 2A through 2D are cross-sectional views showing the progression of manufacturing steps in fabricating the lower electrode of a DRAM capacitor according to one preferred embodiment of this invention.

First, as shown in FIG. 2A, a source/drain region 220 is formed in a substrate 210 using, for example, an ion implantation process. Thereafter, a dielectric layer 230 of, for example, silicon dioxide, is formed over the substrate 210. The dielectric layer 230 can be formed using tetraethoxy silane ($Si(OC_2H_5)_4$) as a gaseous reactant in a low-pressure chemical vapor deposition (LPCVD) process. Next, photolithographic and etching processes are carried out to form a node contact opening 240 in the dielectric layer 230. Subsequently, another LPCVD process is carried out using silane ($SiH_4$) as a gaseous reactant to deposit silicon as well as dopants into the node contact opening 240 and over the dielectric layer 230 to form a polysilicon layer. Hence, a conductive plug 260 is formed inside the node contact opening 240 and a doped polysilicon layer 250a is formed over the dielectric layer 230.

Since a polysilicon layer rather than an amorphous silicon layer is deposited, the rate of deposition at 600° C. is about 100 Å/min. Hence, if a polysilicon layer having a thickness of about 8000 Å is required, only 1.33 hours are needed to complete the deposition process. Compared with the original 16 hours needed to deposit amorphous silicon, this is a tremendous improvement.

Another advantage of depositing doped polysilicon rather than doped amorphous silicon is that a doped polysilicon layer has a higher electrical conductivity. In general, if the dimensions of a device are reduced without changing the material used to form the device, its electrical resistance, and hence its operating speed, will decrease as the cross-sectional area is reduced. Therefore, replacing the doped amorphous silicon with doped polysilicon allows the electrical conductivity of the conductive plug 260 to increase.

Figure 2B:
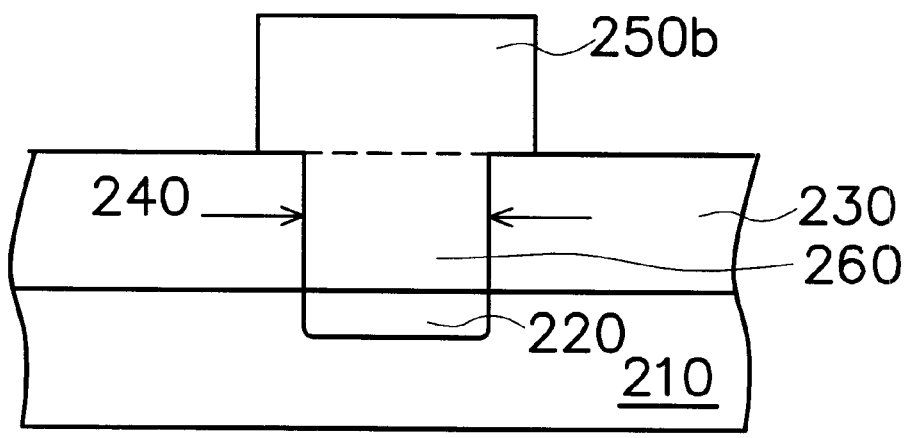

As shown in FIG. 2B, the polysilicon layer 250a is patterned to form a lower electrode 250b.

Figure 2C:
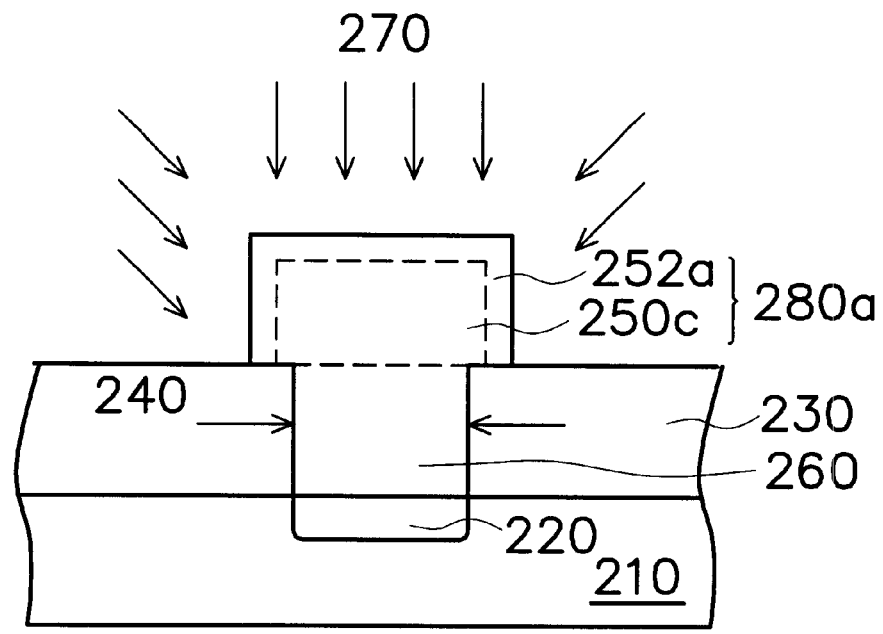

As shown in FIG. 2C, an ion implantation operation is carried out by bombarding the surface of the doped polysilicon lower electrode 250b with ions 270 so that the upper portion of the polysilicon structure is damaged. Consequently, an amorphous layer 252a is formed over the polysilicon layer, so that the lower electrode 280a now comprises an inner core of polysilicon 250c and a surface layer of amorphous silicon 252a. The implantation 270 can be conducted using argon (Ar) ions set to an energy level of between 150 and 200 KeV and a concentration of about $3 \times 10^{14}$ atom/cm$^2$, or using phosphorus (P) ions set to an energy level of between 250 and 300 KeV and a concentration of about $5 \times 10^{14}$ atom/cm$^2$, or using arsenic (As) ions set to an energy level of between 180 and 230 KeV and a concentration of about $10^{14}$ atom/cm$^2$. Furthermore, even nitrogen (N) ions or antimony (Sb) ions can be used. If the ions used in the implantation are phosphorus, arsenic, or antimony, resistance at the surface of the lower electrode will be lowered even further. In addition, since the surface material of the lower electrode is transformed into an amorphous layer, the electric charge will be distributed more evenly and the probability of electrical discharge will be reduced. Thus, the operating speed of the device will be increased.

Because the ions are highly energetic when they are implanted into the lower electrode 280a, the energy can be utilized to break up the regular lattice structure of a doped polysilicon layer near the surface. Therefore, crystalline polysilicon 250b near the surface will be transformed into an amorphous silicon layer 252a. Yet the highly energetic ions are unable to penetrate into the deep interior of the lower electrode; therefore, polysilicon 250c will remain in the core of the lower electrode.

Figure 2D:
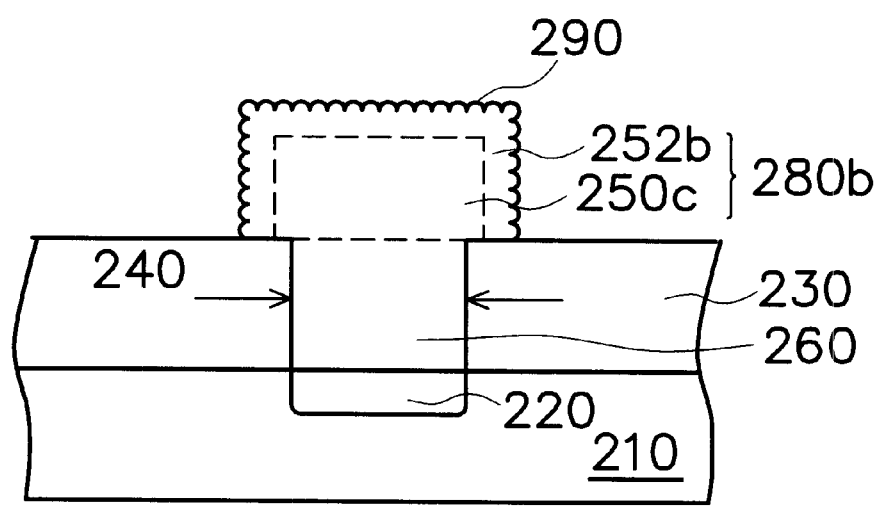

Next, as shown in FIG. 2D, a seeding operation is carried out, and then an annealing operation is conducted in a high vacuum at a temperature of between 550° C. and 570° C. Therefore, hemispherical grain silicon (HSG-Si) 290 is able to grow over the amorphous silicon layer 252a of the lower electrode 280a. Consequently, the overall surface area of the lower electrode 280b will increase to twice its original value. In fact, the lower electrode 280b is now composed of the inner polysilicon layer 250c and the outer amorphous silicon layer 252b, the surface of which is coated with an HSG-Si layer 290.

In summary, the advantages of using the method of this invention to fabricate the lower electrode of a DRAM capacitor include:

1. Since polysilicon rather than amorphous silicon is used to form the lower electrode, the time needed to fabricate the lower electrode is very much reduced. Therefore, productivity can increase several times.

2. Since polysilicon instead of amorphous silicon forms the bulk of matter inside the lower electrode, the conductive plug has a lower electrical resistance. Hence, the device has a higher operating speed.

3. After the conversion of a surface layer of the lower electrode into an amorphous silicon layer through an ion implantation process, silicon atoms can move quite easily along the surface of the lower electrode. Therefore, after the seeding operation, a uniform HSG-Si layer can be readily formed over the surface of the lower electrode during the high vacuum healing operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing the lower electrode of a DRAM capacitor, comprising the steps of:

providing a substrate;

forming a dielectric layer over the substrate;

forming a node contact opening in the dielectric layer;

depositing doped polysilicon layer into the node contact opening and over the dielectric layer;

patterning the doped polysilicon layer to form a lower electrode above the node contact opening;

implanting ions into the surface of the lower electrode to convert a surface of the doped polysilicon layer into an amorphous layer;

performing a seeding operation; and performing a high vacuum annealing operation to form a hemispherical grain silicon layer over a surface of the amorphous layer.

2. The method of claim 1, wherein the step of depositing doped polysilicon includes a low-pressure chemical vapor deposition method.

3. The method of claim 1, wherein the step of implanting ions into the surface of the lower electrode includes implanting argon ions using an energy level of between 150 and 200 KeV at a concentration of about $3 \times 10^4$ atom/cm$^2$.

4. The method of claim 1, wherein the step of implanting ions into the surface of the lower electrode includes implanting phosphorus ions using an energy level of between 250 and 300 KeV at a concentration of about $5 \times 10^{14}$ atom/cm$^2$.

5. The method of claim 1, wherein the step of implanting ions into the surface of the lower electrode includes implanting arsenic ions using an energy level of between 180 and 230 KeV at a concentration of about $10^{14}$ atom/cm$^2$.

6. The method of claim 1, wherein the step of implanting ions into the surface of the lower electrode includes implanting nitrogen ions.

7. The method of claim 1, wherein the step of implanting ions into the surface of the lower electrode includes implanting antimony ions.

8. The method of claim 1, wherein the high vacuum annealing operation is carried out at a high vacuum temperature approximately between 550° C. to 570° C.

9. A method for manufacturing the lower electrode on a substrate having a dielectric layer formed thereon, wherein the dielectric layer comprises a node contact opening exposing a portion of the substrate, the method comprising the steps of:

forming a doped polysilicon layer over the substrate, wherein the doped polysilicon layer fills the node contact opening;

patterning the doped polysilicon layer;

damaging a polysilicon structure of a surface of the doped polysilicon layer to convert the surface of the doped polysilicon layer into an amorphous layer;

performing a seeding operation on a surface of the amorphous layer; and performing a high vacuum annealing operation to form a hemispherical grain silicon layer on the amorphous layer.

\* \* \* \* \*